United States Patent [19]

Slayman et al.

[11] Patent Number: 4,593,304

[45] Date of Patent: Jun. 3, 1986

[54] HETEROSTRUCTURE INTERDIGITAL HIGH SPEED PHOTOCONDUCTIVE DETECTOR

[75] Inventors: Charles W. Slayman, Newbury Park; Luis Figueroa, Woodland Hills, both of Calif.

[73] Assignee: Hughes Aircraft Company, Los Angeles, Calif.

[21] Appl. No.: 559,509

[22] Filed: Feb. 27, 1984

Related U.S. Application Data

[63] Continuation of Ser. No. 255,597, Apr. 20, 1981, abandoned.

[51] Int. Cl.[4] .................... H01L 29/14; H01L 27/12; H01L 29/48; H01L 29/161

[52] U.S. Cl. .................... 357/30; 357/4; 357/15; 357/16; 357/52; 357/58; 357/65

[58] Field of Search .................... 357/1, 4, 15, 16, 30, 357/52, 58, 65

[56] References Cited

U.S. PATENT DOCUMENTS

| | | | |
|---|---|---|---|
| 3,675,026 | 7/1972 | Woodall | 357/61 |
| 3,700,980 | 10/1972 | Belasco et al. | 357/30 |
| 3,993,506 | 11/1976 | Moon | 357/52 |
| 4,021,836 | 5/1977 | Andrews et al. | 357/16 |
| 4,213,138 | 7/1980 | Campbell et al. | 357/16 |
| 4,257,055 | 3/1981 | Hess et al. | 357/16 |
| 4,346,394 | 8/1982 | Figueroa et al. | 357/16 |
| 4,376,285 | 3/1983 | Leonberger et al. | 357/16 |

FOREIGN PATENT DOCUMENTS

| | | | |
|---|---|---|---|
| 54-12261 | 1/1979 | Japan | 357/16 |

OTHER PUBLICATIONS

H. Ando et al., "InGaAs/InP Separated Absorption and Multiplication Regions Avalanche Photodiode Using Liquid- and Vapor-Phase Epitaxies", *IEEE Journal of Quantum Electronics,* vol. QE-17, (1981), pp. 250-254.

J. C. Gammel et al., "An Epitaxial Photoconductive Detector for High Speed Optical Detection", *International Electron Devices Meeting, Technical Digest 1979,* pp. 634-637.

T. Sugeta et al., "Metal-Semiconductor-Metal Photodetector for High-Speed Optoelectronic Circuits", Proceedings of the 11th Conference (1979 International) on Solid State Devices, Tokyo, 1979; *Japanese Journal of Applied Physics,* vol. 19, (1980), Supplement 19-1, pp. 459-464.

T. Sugeta et al., "High-Gain Metal-Semiconductor-Metal Photodetectors for High-Speed Optoelectronic Circuits", 37th Annual DRC June 25-27, 1979, University of Colorado, Boulder, Co., pp. 1855-1856.

*Primary Examiner*—James J. Carroll

*Attorney, Agent, or Firm*—John A. Sarjeant; A. W. Karambelas

[57] ABSTRACT

A high speed photoconductive detector is disclosed which comprises two interdigital electrically conducting electrodes formed on a photoconductive layer. The device speed and sensitivity are improved by using a double-heterostructure configuration comprising an active layer formed on an isolation layer in turn formed on a supporting substrate. A passivation layer is formed on the active layer. This configuration confines the generated carriers to the active layer. Consequently, current will be induced under optical illumination due to photo-carrier generation. This interdigitated geometry allows for a large device cross-section and small carrier transit distance.

13 Claims, 2 Drawing Figures

20 18 15 16 20 14 12 26 10

Fig. 1.
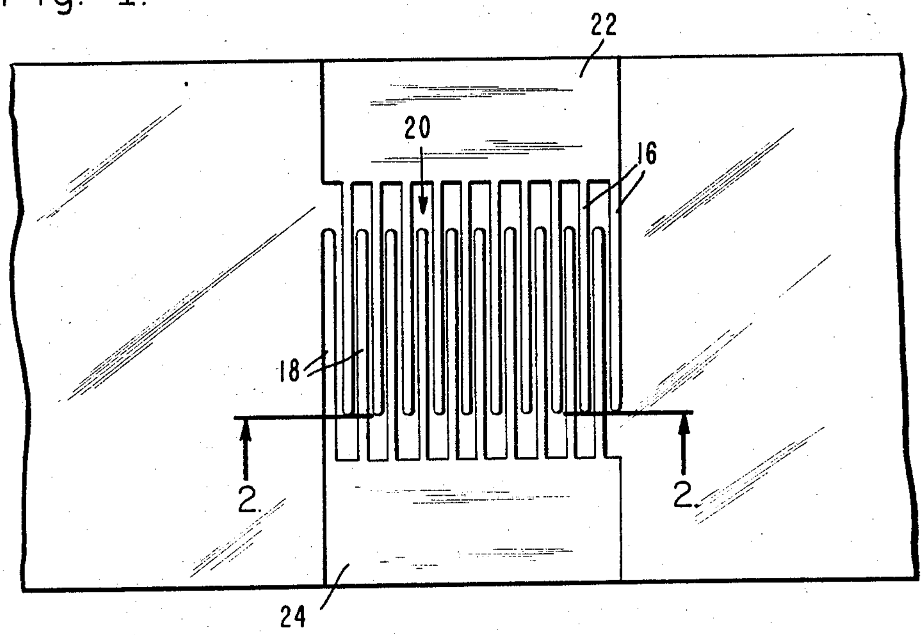
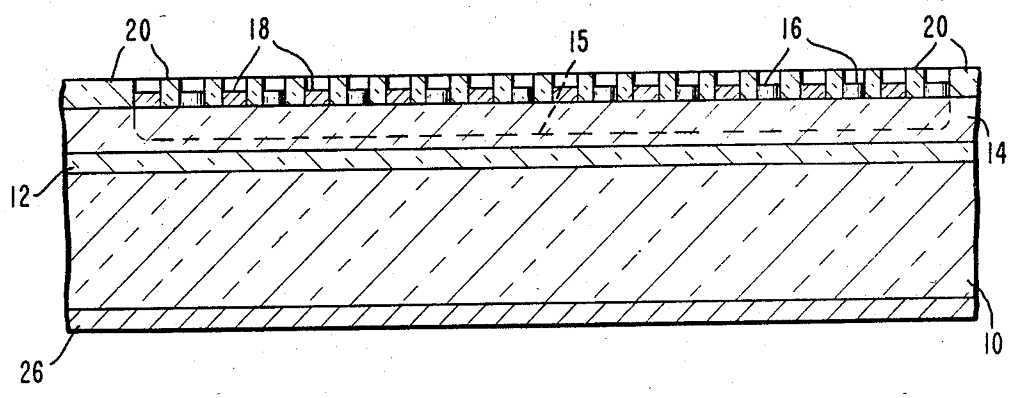
Fig. 2.

HETEROSTRUCTURE INTERDIGITAL HIGH SPEED PHOTOCONDUCTIVE DETECTOR

The present invention is related to an invention described in copending patent application Ser. No. 584,219 filed Feb. 27, 1984 which is a continuation of patent application Ser. No. 255,595 filed Apr. 20, 1981 both abandoned, which describes a high speed photoconductive detector.

BACKGROUND OF THE INVENTION

1. Field of the Invention

This invention relates to high speed photodetectors, and, more particularly, to high speed photodetectors incorporating an interdigital metal electrode pattern formed on a heterostructure configuration. By high speed is meant that the analog frequency response is greater than about 1 GHz, or, the device rise and fall times are less than about 200 ps.

2. Description of the Prior Art

Conventional photoconductive detectors rely on the difference in the transit time of one carrier type versus the recombination time of the other carrier type to achieve gain. This is at the cost of device speed. The use of photoconductive two-terminal devices for high speed photodetection has been proposed by Sugeta et al, Vol. ED-26, IEEE Transactions on Electron Devices, pp. 1855–1859 (1979) and Gammel et al, IEDM Technical Digest, pp. 634–637 (1979). However, both types of devices rely on blocking contacts and are recombination-time limited.

SUMMARY OF THE INVENTION

In accordance with the invention, a high speed photoconductive detector responsive to incident optical radiation comprises:

(a) a substrate of semiconductor material;

(b) an isolation layer of semiconductor material formed on at least a portion of the substrate;

(c) an active layer of semiconductor material having a bandgap less than that of the semiconductor material comprising the isolation layer and supported on the isolation layer; and (d) a pair of interdigitated electrically conducting electrodes formed on a portion of the surface of the active layer so as to be in non-blocking contact therewith, at least one of said electrodes forming a Schottky barrier contact to said active layer, the thickness of said active layer being approximately equal to or less than the spacing between said electrodes.

In this device, current is induced under optical illumination due to photo-carrier generation. The interdigital geometry allows for a large device cross-section and small carrier transit distance.

BRIEF DESCRIPTION OF THE DRAWING

FIG. 1 is a plan view showing a pattern of interdigitated conducting electrodes on a semiconductor surface; and FIG. 2 is a cross-section view through 2—2 of FIG. 1, depicting an embodiment of the invention.

DETAILED DESCRIPTION OF THE INVENTION

In order to obtain high speed photodetection, carrier transit time and device circuit parasitics must be taken into account. A two-terminal photoconductor for high speed and high sensitivity photodetection is provided herein. The device comprises two conducting electrodes separated by a photosensitive barrier of semiconductor material. The geometry of the device is such that (1) there is a relatively large active area, (2) the electrodes are placed in close proximity so that photo-carriers generated by incident optical radiation are rapidly swept out of the semiconductor, and (3) the effect of parasitic circuit elements is minimized. The electrodes and semiconductor material are selected such that (1) high bias fields can be used to achieve maximum photocarrier velocities, (2) bulk surface and electrode/semiconductor interface trapping effects are eliminated in order to prevent anomalous low frequency response, and (3) photo-carrier transit times are less than recombination times to allow for high internal collection efficiencies.

Referring to FIGS. 1 and 2, and noting that the horizontal scale of FIG. 2 has been expanded for clarity, the device of the invention comprises:

(a) a substrate 10 of semiconductor material;

(b) an isolation layer 12 of semiconductor material formed on at least a portion of the substrate;

(c) an active layer 14 of semiconductor material having a bandgap less than that of the semiconductor material comprising the isolation layer and supported on the isolation layer;

(d) a pair of interdigitated electrically conducting electrodes 16, 18 formed on a portion of the surface of the active layer; and (e) a passivation layer 20 of semiconductor material having a bandgap greater than that of the semiconductor material comprising the active layer and formed on at least portions of the active layer exposed by the interdigitated electrodes.

The discussion which follows is presented in terms of employing III-V semiconductor materials, preferably GaAs and InP, and mixed III-V semiconductor materials, preferably (Al,Ga)As, (In,Ga)As and (In,Ga)(As,P). In particular, the following discussion is generally directed to a structure comprising a substrate of GaAs, an isolation layer of (Al,Ga)As, an active layer of GaAs and a passivation layer of (Al,Ga)As. In addition to employing III-V and mixed III-V materials, it should be understood that II-VI and mixed II-VI semiconductor materials such as PbTe and (Pb,Sn)Te, respectively, may alternatively be employed in fabricating the detector of the invention. Finally, while one device is depicted, it should be understood that a plurality of devices may be formed simultaneously on one substrate, as is common in the art of fabricating semiconductor devices.

The composition of the substrate is not critical and preferably comprises a III-V material such as GaAs or InP or a II-VI material such as PbTe. Most preferably, semi-insulating material is employed, which minimizes shunt currents that would otherwise cause a decrease in efficiency and an increase in the shot noise of the system. Examples of suitable semi-insulating substrate materials include chromium-doped GaAs and iron-doped InP.

Isolation layer 12 serves to isolate active layer 14 from substrate 10. For an isolation layer of (Al,Ga)As, the thickness of the isolation layer ranges from 1 to 10 μm. Less than about 1 μm does not provide adequate isolation, while thicknesses greater than about 10 μm are likely to evidence terracing during crystal growth as well as permitting the generation of shunt currents which can result in loss in efficiency and an increase in leakage current. The isolation layer, if of different semiconductor material than the substrate, also serves to provide both support and an etch stop in the event that holes are etched in the backside of the substrate to provide introduction of light from optical fibers to the backside of the device.

A suitable mixed III-V semiconductor material for the isolation layer comprises $Al_xGa_{l-x}As$. The value of x depends on the wavelength range of the incident optical radiation, and in any event ranges from about 0.37 to 0.85. The value of x should be at least 0.37 in order to provide an indirect bandgap material which consequently has high resistivity and low mobility and serves to confine the carriers because of the difference in bandgap between the isolation layer and the active layer. The value of x should not exceed about 0.85, especially if illumination from the front side (interdigitated conducting electrode side) is contemplated, due to poor crystal morphology at the interface between the isolation layer and the active layer.

Active layer 14 preferably comprises a III-V material such as GaAs and provides a region 15 where carriers are generated by action of incident optical radiation. The bandgap of the semiconductor material comprising the active layer 14 should be less than the bandgaps of the semiconductor material comprising the isolation layer 12 and the passivation layer 20. First, a larger bandgap for the cladding layers permits light to pass through the cladding layers into the active layer. As discussed above, it might be desirable to introduce light from the backside of the device, and a larger bandgap for the material comprising the isolation layer permits this configuration. Second, once photo-carriers are generated in the active layer, the presence of cladding layers of larger bandgap will serve to confine the carriers in the active layer, thereby promoting high efficiency. Leakage of carriers between layers will occur if the difference in bandgaps is too small; for GaAs/(Al/-Ga)As, the minimum bandgap difference to avoid such leakage is about 0.1 eV. The bandgap difference is controlled by controlling the composition of (Al,Ga)As, as is well-known.

The thickness of the active layer depends on the absorption length of the optical radiation incident on the device. For most applications, it is contemplated that the wavelength of the optical radiation will range from about 0.53 to 0.88 $\mu$m. Since it is desired that substantially all optical radiation be absorbed, the thickness of the active layer should be about three penetration depths, where the penetration depth is defined as the inverse of absorption coefficient of the material. The absorption coefficient $\alpha$ of gallium arsenide ranges from about $5\times10^3$ to $2\times10^4$ cm$^{-1}$ for wavelengths 8,800 Å$<\lambda<$5,300 Å. (The absorption coefficient varies according to incident wavelength; for a wavelength of 8,800 Å, $\alpha=5\times10^3$ cm$^{-1}$ and for a wavelength of 5,300 Å, $\alpha=2\times10^4$ cm$^{-1}$.) Preferably, the thickness of the active layer varies from about 1.5 to 6 $\mu$m over this wavelength range, with thinner layers associated with shorter wavelengths. Such a selection provides that greater than 95% of incident optical radiation will be absorbed in the active layer. The maximum thickness of the active layer is set by an attempt to minimize shunt currents while maintaining a uniform electric field, which is possible only for depths approximately equal to the spacing between the conducting electrodes.

Thus, the thickness of the active layer is chosen depending on the wavelength range of operation. The important criterion is that the thickness of the active layer cannot be greater than the electrode spacing. Since, as noted above, the electric field only penetrates over a depth approximately equal to the electrode spacing, then as the thickness of the active layer is reduced in order to increase the speed of the device, there will be some loss in efficiency. For example, for a thickness of 0.5 $\mu$m, about 28% of incident optical radiation at a wavelength of 8,300 Å is absorbed. Thus, these two competing considerations must be taken into account when fabricating the device. However, detector speed can be increased at the expense of sensitivity using the heterostructure configuration provided herein. Since the bandgap energies of the isolation layer 12 and passivation layer 20 are larger than the incident photon energy, photo-carriers will be generated and confined in the active layer. The active layer thickness along with the electrode spacing can then be decreased to minimize transit time effects, consistent with advances in photolithographic processing technology. Most preferably, for maximum efficiency and high speed, the thickness of the active layer 14 should be selected so that upon application of a bias, the active region 15 thereby created substantially coincides in depth with the active layer.

The potential speed of the device is also limited by how thin an active layer one can grow. Assuming a thickness d of 0.1 $\mu$m, and a saturation velocity of the slower carrier $V_{sat}$ of about $10^7$ cm/s, then the speed of the device $t_{tr}$ is given by $$t_{tr}=d/V_{sat}\sim10^{-12}s=1 \text{ ps.}$$

That speed corresponds to an analog frequency response $\Delta f$ of about 22 to 35 GHz.

Even thinner active layers may be grown. For example, using molecular beam epitaxy or metal-organic vapor phase epitaxy, layers of GaAs of 100 Å may be formed. However, the speed of the device is obtained at the expense of device sensitivity, since less light is absorbed in thinner active layers.

The isolation and active layers are formed by conventional growth techniques such as liquid phase epitaxy, vapor phase epitaxy, molecular beam epitaxy, or other suitable method. Further, these layers are undoped in order to obtain high resistivity $\rho$ of greater than on the order of about 100 Ω-cm and preferably greater than about $10^4$ Ω-cm. The term "undoped" is used herein to include unintentionally doped material. Such unintentional doping arises as a consequence of the growth process, and the extent of unintentional doping is thus dependent on technological advances in growth techniques. For liquid phase epitaxial growth, background n-type doping of about 1 to $3\times10^{15}$ cm$^{-3}$ is typically obtained for the semiconductor materials of interest described herein.

To achieve maximum speed, the device must be operated at saturation velocity. In III-V materials, electron velocity saturates rapidly with an electric field, while hole velocity saturates comparatively slowly. Therefore, the device must be operated at a high enough field to saturate the hole velocity. For GaAs, this requires fields on the order of 30 to 100 kV/cm. Thus, the active layer must be one which can withstand high electric fields without breaking down in order to realize the high speed properties of the device. Also, the active layer should have a bandgap less than the energy of the incident optical radiation in order to absorb substantially all incident optical radiation. High quality material is ensured by employing a material in which the room temperature mobility of electrons is greater than about 3,000 $cm^2/V$-s (for III-V compounds).

The interdigitated electrically conducting electrodes 16, 18 formed on the active layer may form either blocking or non-blocking contacts with the semiconductor material comprising the active layer. Preferably, in order to provide for transit time-limited performance, the electrically conducting electrodes form non-blocking contacts. The electrically conducting electrodes may comprise a metal, such as aluminum or gold. Alternatively, transparent conducting electrodes, such as $Cd_2O_3$ and $SnO_2$ and mixtures of $In_2O_3$ and $SnO_2$ (ITO), may be employed.

The spacing between the interdigitated fingers (distance between neighboring digits) should be no more than about 5 μm; this provides a device rise time (transit time) of about 50 ps and a response of about 6 to 8 GHz. Shorter spacings, to the extent they may be economically fabricated, provide correspondingly shorter rise times and higher analog frequency response. In order to obtain a high collection efficiency, the optical attenuation depth $1/\alpha$, of the active layer where $\alpha$ is the absorption coefficient of the active layer, must be less than the electrode spacing, as described above.

The electrodes should be thick enough to minimize series resistance; accordingly, a thickness of about 2,000 Å is sufficient. Conveniently, the well-known photoresist lift-off technique is used to form contacts. Accordingly, the contacts would not be so thick as to provide problems with this technique; a suitable maximum thickness is about 5,000 Å.

The area of the interdigital electrodes controls the RC time constant. Therefore, to decrease spacing, the area must also be correspondingly decreased because of capacitive effects between the fingers.

Since the electrodes shadow the active area of the detector during front side illumination, the finger width should be made as narrow as possible for high light collection efficiency.

In order to make the transit and parasitic RC time constants comparable, the overall interdigital dimensions, (i.e., array length by array width) must be properly chosen.

Both electrodes can be ohmic contacts or one can be ohmic and the other Schottky barrier or both can be Schottky barrier in close proximity. For the ohmic pair, the semiconductor material should be a high resistivity material to allow for high fields. For the ohmic-Schottky combination, the Schottky should be reverse biased and its depletion region should extend to the ohmic contact so that all photo-carriers are generated in the high field region. For the Schottky pair, the semiconductor material should be of sufficient resistivity so that the depletion width is greater than the finger spacing. The two electrode depletion regions will then extend into each other so that the Schottky contact that is forward biased will not block photo-carriers. Internal bias fields can be created by using different work function metals for the two electrodes. However, if the same material is used for both electrodes, the necessity of aligning the two electrodes is eliminated, (a single masking step being necessary to provide both electrodes which are, therefore, inherently aligned with respect to one another) but the detector must be externally biased to obtain high speed operation. Biasing, whether external or internal, creates the active region 15.

Passivation layer 20 serves to protect the active layer 14 from air and provides a low surface recombination interface with the active layer, thereby reducing recombination and trapping at the surface of the active layer. A suitable material for the passivation layer is a mixed III-V semiconductor material such as $Al_yGa_{l-y}As$, formed by conventional methods as discussed for the isolation and active layers. The thickness of the passivation layer should be as thin as possible; for (Al,Ga)As, a range of about 0.2 to 0.5 μm is advantageously employed. If this layer is too thick, then it will be difficult to form contacts 16, 18, while if the layer is too thin, then it will be discontinuous, which could affect surface properties of the device. The resistivity of the passivation layer should be as high as possible (at least about 100 Ω-cm) and therefore again, as with the isolation and active layers, undoped material, as defined above, is preferably employed.

If the bandgap is less than the energy of the incident optical radiation, then the semiconductor material will absorb all the incident optical radiation. For $Al_yGa_{l-y}As$, a value of y=0.85 in the passivation layer provides a material which is transparent to wavelengths down to about 0.53 μm, while a value of y=0.37 provides a material transparent to wavelengths down to about 0.70 μm. Accordingly, y ranges from about 0.37 to 0.85. The same considerations apply in selecting a value for x for use of $Al_xGa_{l-x}As$ in the isolation layer where backside illumination is contemplated. Although desirable, it is not necessary that the values of x and y be identical for the isolation and passivation layers.

Detection of longer wavelengths is limited by the bandgap of the active region. For GaAs, this implies a maximum wavelength of optical radiation that may be measured of about 0.88 μm. If it is desired to measure optical radiation at wavelengths greater than about 1 μm, then a ternary material such as (In,Ga)As may be employed, as described below, which permits detection of wavelengths out to about 1.6 μm.

Appropriate openings are formed in the passivation layer 20 to expose portions of the active layer 14 for forming conducting electrodes 16, 18 thereon. While a number of techniques may be used to remove portions of the passivating layer, chemical etching is advantageously employed. When employing etching, the crystallographic orientation of the passivation layer should be such that the side walls in the area where the passivation material is removed are vertical (as shown) or, preferably, dovetail shape, as opposed to boat-shape. For (Al,Ga)As, a convenient etchant is the conventional $H_2SO_4$—$H_2O_2$—$H_2O$ in a ratio of 1:8:8; another convenient etchant is hydrofluoric acid (e.g., 48 molar %). HF is selective to $Al_yGa_{l-y}As$ for values of y of about 0.4 and greater.

A microstrip transmission line 22, 24 is connected to each electrode. The microstrip transmission line forms a non-dispersive line, which is preferable because of the bandwidth and ease of fabrication. Other connecting lines, such as coplanar transmission lines, may alternately be used.

Using microstrip lines requires a ground plane 26, to which one of the lines is grounded (by means not shown). The other line is connected to a coaxial cable (not shown) via a conventional microstrip launcher. Thus, the need for bonding wires is eliminated.

Although the thickness of the substrate is not critical in fabricating the photodetector of the invention, it must be selected consistent with the design of the transmission line, using well-known techniques.

The microstrip transmission lines are conveniently fabricated simultaneously with the interdigitated electrodes employing procedures well-known in the art, such as sputtering or evaporation. The ground plane is conveniently similarly deposited on the backside of the substrate or can be formed by securing the photodetector to the surface of a metal carrier. An opening (not shown) of the desired size may be made in the ground plane for backside illumination.

Examples of other semiconductor materials suitably employed in fabricating the device of the invention include the combinations listed below. The range of operating wavelength is given.

| Substrate | Isolation Layer (Thickness, μm) | Active Layer (Thickness, μm) | Passivation Layer (Thickness, μm) | Operating Wavelength, μm |
|---|---|---|---|---|
| PbTe | PbTe | (Pb,Sn)Te | PbTe (0.1 to 0.5) | 5 to 30 |
| InP | InP (1 to 10) | (In,Ga)As (1.5 to 6) | InP (0.1 to 0.5) | 0.9 to 1.6 |

The substrate is preferably semi-insulating, e.g., Fe-doped InP. The isolation layer in each case is conveniently a liquid phase epitaxially grown layer. The active layer is preferably lattice-matched to the isolation layer in order to reduce interface problems; for InP, a layer of $In_{0.53}Ga_{0.47}As$ is desirably employed. Advantageously, the structures listed in the Table above permit optical radiation to be introduced through the backside of the device without the need for etching holes in the substrate, since the substrate and isolation layer have a larger bandgap than the active layer. Thus, an increase in device efficiency is realized, since more light is available for the same area.

EXAMPLE

A major surface of a Cr-doped GaAs semi-insulating substrate about 400 μm thick and having a resistivity of $10^6$ Ω-cm was cleaned following procedures well-known in the art of semiconductor processing. An isolation layer of $Al_{0.4}Ga_{0.6}As$ was formed to a thickness of 3 μm on the major surface, followed by an active layer of unintentionally doped GaAs, 5 μm thick. A passivation layer of unintentionally doped $Al_{0.4}Ga_{0.6}As$ was formed on the active layer to a thickness of 0.5 μm. All three layers were formed by conventional liquid phase epitaxy. The passivation layer was patterned to provide for deposition of interdigitated metal electrodes and microstrip transmission lines, and undesired portions were removed by chemical etching using $H_2SO_4$:$H_2O_2$:$H_2O$ (1:8:8). An interdigitated pattern of aluminum was deposited by evaporation on the exposed portions of the active layer by photolithographic lift-off technique to a thickness of about 0.4 μm to form non-blocking contacts with the active layer. The fingers were 160 μm long and 200 μm wide. The device area was thus $3.2\times10^{-4}$ cm$^2$. The finger spacing between electrodes was 5 μm. A microstrip transmission line of aluminum, 0.4 μm thick, associated with each electrode was simultaneously deposited on the exposed portions of the active layer. A ground plane of bulk aluminum served as support for the photodetector and was connected to one of the microstrip lines by a brass tab.

To test the response of the device, the other microstrip line was connected to a coaxial cable and sampling oscilloscope via a microstrip line launcher.

The bias voltage applied to the electrode was 20 V, which corresponded to a field of 40 kV/cm. The device leakage current at that voltage was less than 0.2 μA. Incident optical radiation was at 0.83 μm, provided by a mode-locked GaAs/(Al,Ga)As diode laser. The 10% to 90% rise time at 25 V was 50 to 60 ps and the 90% to 10% fall time was 50 to 60 ps. The device thus evidenced a symmetric rise and fall time.

The analog bandwidth was greater than 4 GHz (limited by frequency response of the laser). From the pulse response, the extrapolated value was calculated to be 4.4 to 7 GHz. The device sensitivity was about 0.1 to 0.3 mA/mW.

What is claimed is:

1. A high speed conductive detector responsive to incident optical radiation comprising:

(a) a substrate of semiconductor material;

(b) an isolation layer of semiconductor material formed on at least a portion of said substrate;

(c) an active layer of semiconductor material having a bandgap less than that of said semiconductor material comprising said isolation layer and supported on said isolation layer; and (d) a pair of interdigited electrically conducting electrodes formed on a portion of the surface of said active layer so as to be in non-blocking contact therewith, at least one of said electrodes forming a Schottky-barrier contact with said active layer, the thickness of said active layer being approximately equal to or less than the spacing between said electrodes.

2. The detector of claim 1 further comprising means for applying a bias to said conducting electrodes.

3. The detector of claim 1 in which said substrate comprises semi-insulating material.

4. The detector of claim 1 in which said semiconductor material is selected from the group consisting of III-V and II-VI semiconductor material.

5. The detector of claim 4 comprising:

(a) a substrate of III-V semi-insulating material;

(b) an isolation layer of III-V material formed on at least a portion of said substrate;

(c) an active layer of III-V material supported on said isolation layer;

(d) a pair of interdigitated electrically conducting electrodes formed on a portion of the surface of said active layer; and (e) a passivation layer of III-V material formed on at least portions of said active layer exposed by said interdigitated electrodes.

6. The detector of claim 5 comprising:

(a) a semi-insulating substrate of chromium-doped GaAs;

(b) an isolation layer of undoped $Al_xGa_{l-x}As$, where x ranges from about 0.37 to 0.85, ranging in thickness from about 1 to 10 μm;

(c) an active layer of undoped GaAs, ranging in thickness from about 1.5 to 6 μm;

(d) a pair of interdigitated electrically conducting electrodes formed on a portion of the surface of said active layer; and (e) a passivation layer of undoped $Al_yGa_{l-y}As$, where y ranges from about 0.37 to 0.85, ranging in thickness from about 0.2 to 0.5 μm.

7. The detector of claim 5 comprising:

(a) a semi-insulating substrate of iron-doped InP;

(b) an isolation layer of undoped InP ranging in thickness from about 1 to 10 μm;

(c) an active layer of undoped (In,Ga)As having a composition which is lattice-matched to the lattice of said isolation layer and ranging in thickness from about 1.5 to 6 μm;

(d) a pair of interdigitated electrically conducting electrodes formed on a portion of said active layer; and (e) a passivation layer of undoped InP ranging in thickness from about 0.2 to 0.5 μm.

8. The detector of claim 4 comprising:

(a) a substrate of II-VI semi-insulating material;

(b) an isolation layer of II-VI material formed on at least a portion of said substrate;

(c) an active layer of II-VI material supported on said isolation layer;

(d) a pair of interdigitated electrically conducting electrodes formed on a portion of the surface of said active layer; and (e) a passivating layer of II-VI material formed on at least portions of said active layer exposed by said interdigitated electrodes.

9. The detector of claim 8 comprising:

(a) a semi-insulating substrate of PbTe;

(b) an isolation layer of undoped PbTe;

(c) an active layer of undoped (Pb,Sn)Te having a composition which is lattice-matched to the lattice of said isolation layer;

(d) a pair of interdigitated electrically conducting electrodes formed on a portion of said active layers; and (e) a passivation layer of undoped PbTe.

10. The detector of claim 1 in which the spacing between each finger of said interdigitated electrodes is less than about 5 μm.

11. The detector of claim 1 further comprising a microstrip transmission line connected to each electrode.

12. The detector of claim 1 in which said electrically conducting electrodes comprise a metal.

13. The detector of claim 12 in which said metal is selected from the group consisting of aluminum and gold.

* * * * *